(12) United States Patent
Lee et al.

(10) Patent No.: US 10,802,308 B2
(45) Date of Patent: Oct. 13, 2020

(54) ROLL TO ROLL FABRICATION APPARATUS

(71) Applicant: LG DISPLAY CO., LTD., Seoul (KR)

(72) Inventors: Kyuhwang Lee, Seoul (KR); Yunho Kook, Paju-si (KR); Chulho Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/723,760

(22) Filed: Oct. 3, 2017

(65) Prior Publication Data
US 2018/0149902 A1    May 31, 2018

(30) Foreign Application Priority Data
Nov. 28, 2016   (KR) ................. 10-2016-0159701

(51) Int. Cl.
*B05C 11/06* (2006.01)
*B05B 12/34* (2018.01)
(Continued)

(52) U.S. Cl.
CPC ........ *G02F 1/133305* (2013.01); *B05C 11/06* (2013.01); *B05D 1/02* (2013.01); *B05D 1/40* (2013.01); *B05D 3/042* (2013.01); *B32B 17/10137* (2013.01); *B32B 37/0053* (2013.01); *D21H 25/16* (2013.01); *G02F 1/1303* (2013.01); *G03F 7/30* (2013.01); *G03F 7/3064* (2013.01); *H01L 21/6708* (2013.01); *H01L 21/67051* (2013.01); *H01L 51/0023* (2013.01); *H01L 51/0097* (2013.01); *H01L 51/56* (2013.01); *B05B 1/14* (2013.01); *B05B 12/18* (2018.02); *B05B 12/32* (2018.02); *B05B 12/34* (2018.02); *B05B 13/0207* (2013.01); *B05D 2252/02* (2013.01); *B21B 45/0278* (2013.01); *B32B 2457/206* (2013.01); *C25D 17/004* (2013.01);
(Continued)

(58) Field of Classification Search
None
See application file for complete search history.

(56) References Cited

U.S. PATENT DOCUMENTS 2,386,156 A * 10/1945 Woodward ............ B05C 11/06
                                                 101/159
3,779,206 A * 12/1973 Sato ...................... G03G 15/11
                                                 118/104
(Continued)

FOREIGN PATENT DOCUMENTS

CN          1440057 A        9/2003
CN        104556718 A        4/2015
(Continued)

OTHER PUBLICATIONS

Extended European Search Report, dated Apr. 5, 2018, for European Application No. 17202026.5-1210, 7 pages.

*Primary Examiner* — Binu Thomas
(74) *Attorney, Agent, or Firm* — Seed IP Law Group LLP

(57) ABSTRACT

A roll to roll fabrication apparatus includes an injection plate for injecting a chemical treatment liquid on a film transferred from a supplying roll to a collecting roll; and liquid blocking rolls disposed between the supplying roll and the collecting roll, and configured to prevent the chemical treatment liquid injected from the injection plate from being introduced to another process region.

11 Claims, 5 Drawing Sheets

(51) Int. Cl.

| | |
|---|---|
| *G02F 1/1333* | (2006.01) |
| *B05D 1/02* | (2006.01) |
| *H01L 21/67* | (2006.01) |
| *G02F 1/13* | (2006.01) |
| *G03F 7/30* | (2006.01) |
| *B05D 3/04* | (2006.01) |
| *B05D 1/40* | (2006.01) |
| *H01L 51/00* | (2006.01) |
| *D21H 25/16* | (2006.01) |
| *B32B 17/10* | (2006.01) |
| *B32B 37/00* | (2006.01) |
| *H01L 51/56* | (2006.01) |
| *B05B 12/18* | (2018.01) |
| *B05B 12/32* | (2018.01) |
| *B05B 1/14* | (2006.01) |
| *B05B 13/02* | (2006.01) |
| *B21B 45/02* | (2006.01) |
| *C25D 17/00* | (2006.01) |

(52) U.S. Cl.
CPC ..... *H01L 2251/5338* (2013.01); *Y02E 10/549* (2013.01)

(56) References Cited

U.S. PATENT DOCUMENTS

| | | | | |
|---|---|---|---|---|
| 3,931,786 | A | * | 1/1976 | Teed ............. B05C 1/0813 118/235 |
| 4,270,317 | A | * | 6/1981 | Kurie ............ A61L 9/01 134/64 R |
| 4,428,659 | A | | 1/1984 | Howard |
| 4,608,941 | A | * | 9/1986 | Morris ........... B23K 3/0653 118/404 |
| 5,313,685 | A | * | 5/1994 | Kramer .......... B21B 45/0278 15/309.1 |
| 5,374,331 | A | | 12/1994 | Costello |
| 6,440,215 | B1 | * | 8/2002 | Lymn ............ B05C 11/06 118/62 |
| 2008/0101792 | A1 | * | 5/2008 | Fromson ........ G03D 5/00 396/611 |
| 2009/0056749 | A1 | * | 3/2009 | Hori ............. B05C 1/0817 134/6 |
| 2011/0151130 | A1 | * | 6/2011 | Kariyasu ........ B05C 1/083 118/258 |
| 2012/0111365 | A1 | * | 5/2012 | Kunze ........... B05C 3/09 134/15 |

FOREIGN PATENT DOCUMENTS

| | | |
|---|---|---|
| EP | 2 428 992 A2 | 3/2012 |
| JP | 2003-243801 A | 8/2003 |

* cited by examiner

ROLL TO ROLL FABRICATION APPARATUS

CROSS-REFERENCE TO RELATED APPLICATION

Pursuant to 35 U.S.C. § 119(a), this application claims the benefit of an earlier filing date of and the right of priority to Korean Application No. 10-2016-0159701, filed on Nov. 28, 2016, the contents of which are incorporated by reference herein in its entirety.

BACKGROUND

Technical Field

This specification relates to a roll to roll fabrication apparatus, and more particularly, to a roll to roll fabrication apparatus capable of rapidly performing processes and capable of uniformly performing a developing process.

Description of the Related Art

Recently, a flexible display device using a ductile substrate such as a plastic substrate is being developed for enhanced portability and convenience. Such a flexible display device is fabricated in a following manner. Firstly, a substrate formed of a plastic material such as polyimide is attached onto a mother substrate formed of glass. Then, a plurality of display panels are formed on the mother substrate through various processes including a TFT process, then the mother substrate is cut in unit of the display panels, and the plastic substrate is separated from the mother substrate.

However, the conventional method to fabricate such a flexible display device has the following problems.

Recently, ongoing researches are actively conducted to reduce fabrication costs of an expensive display device by fabricating the display device through a consecutive inline process. However, in case of attaching a plastic substrate onto a glass mother substrate, the expensive glass substrate of a large area is required. This may cause fabrication costs to be increased, and equipment and processes to be additionally required since the plastic substrate and the glass substrate should be attached to each other and then separated from each other. As a result, entire fabrication costs are increased.

Further, processes are performed in each unit of the mother substrate, even if a plurality of display panels are formed on the large mother substrate (glass substrate). As a result, a consecutive inline process cannot be performed.

BRIEF SUMMARY

Therefore, aspects of the detailed description provide a roll to roll fabrication apparatus capable of performing an inline process rapidly and consecutively, by forming display panels on a film which is transferred between rolls.

Other aspects of the detailed description provide a roll to roll fabrication apparatus capable of preventing a chemical treatment liquid for a corresponding process region from being introduced into another process region by using liquid blocking rolls, and capable of maintaining a uniform thickness of the applied chemical treatment liquid.

To achieve these and other advantages and in accordance with the purposes of this specification, as embodied and broadly described herein, there is provided a roll to roll fabrication apparatus, comprising: an injection plate for injecting a chemical treatment liquid on a film transferred from a supplying roll to a collecting roll; and liquid blocking rolls disposed between the supplying roll and the collecting roll, and configured to prevent the chemical treatment liquid injected from the injection plate from being introduced to another process region.

The roll to roll fabrication apparatus further comprises: air curtains disposed at boundaries of a corresponding process region, and configured to prevent the chemical treatment liquid from being introduced to another process region by injecting air; and shielding members disposed at the boundaries of the corresponding process region, and configured to prevent air from the air curtains from being injected to the corresponding process region.

The chemical treatment liquid includes a developing solution and an etching solution. And the liquid blocking rolls are installed to be moveable up and down according to a thickness of the chemical treatment liquid to be applied, such that the chemical treatment liquid is constantly applied onto the film.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate exemplary embodiments and together with the description serve to explain the principles of the disclosure.

BRIEF DESCRIPTION OF THE SEVERAL VIEWS OF THE DRAWINGS

Figure 1:
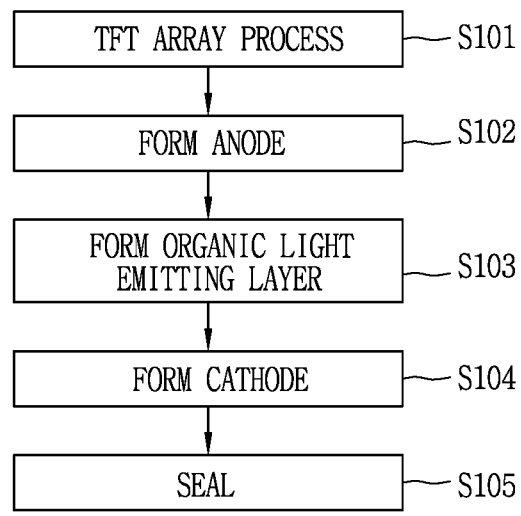
Figure 2:
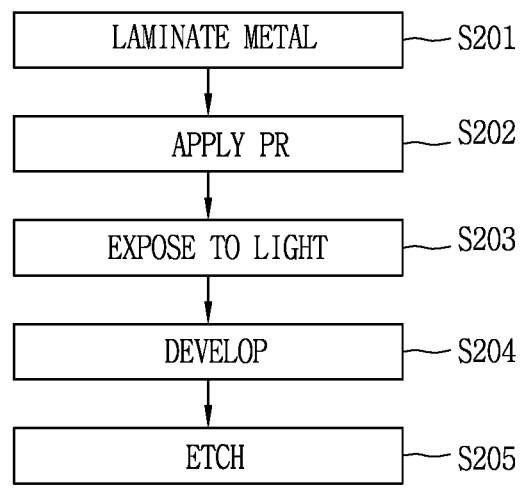
Figure 3:
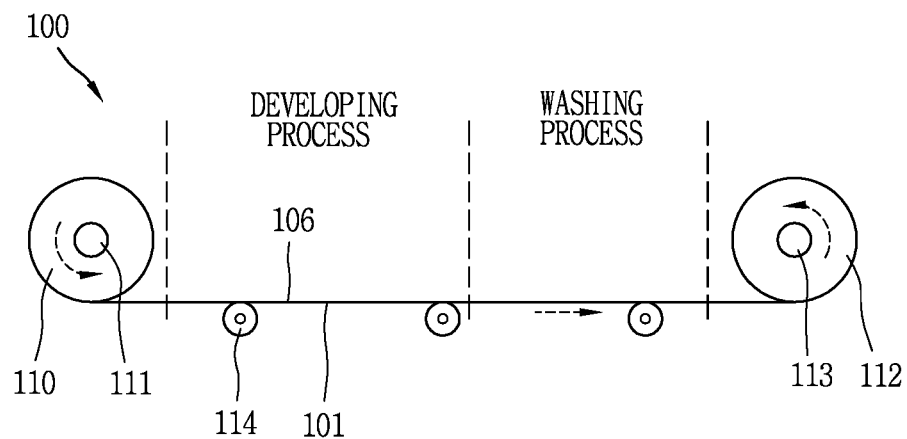
Figure 4A:
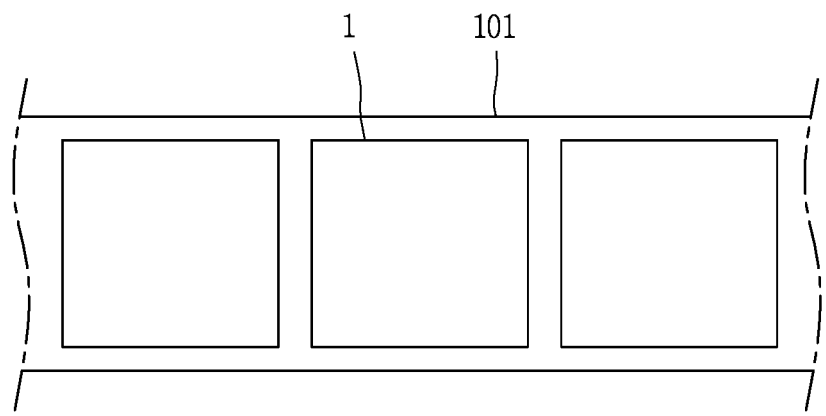
Figure 4B:
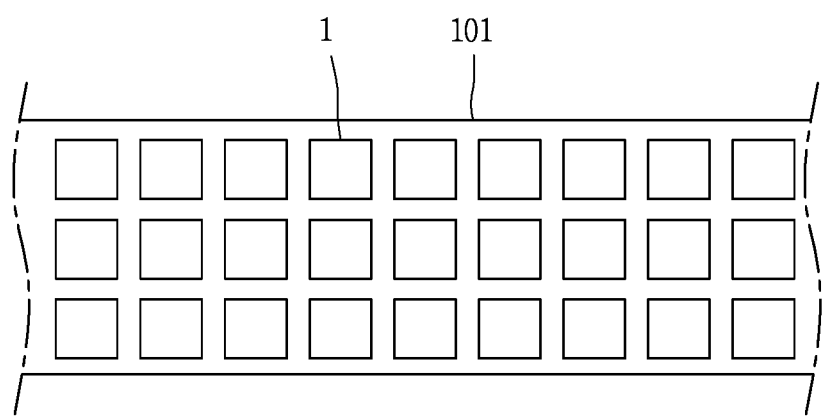
Figure 5A:
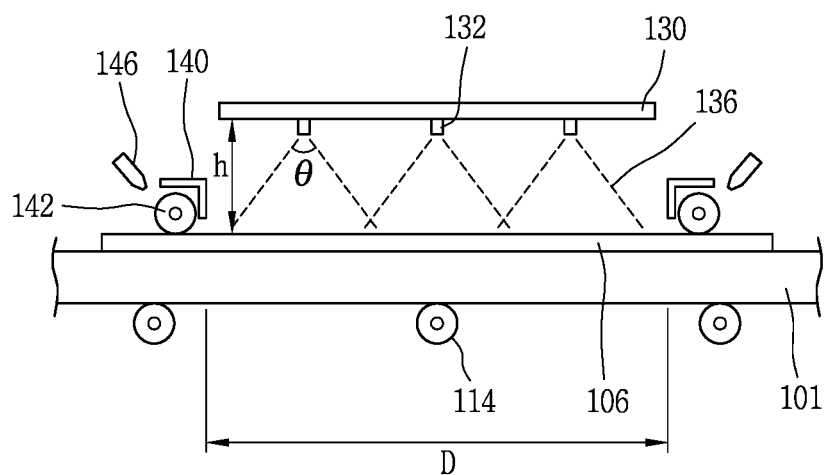
Figure 5B:
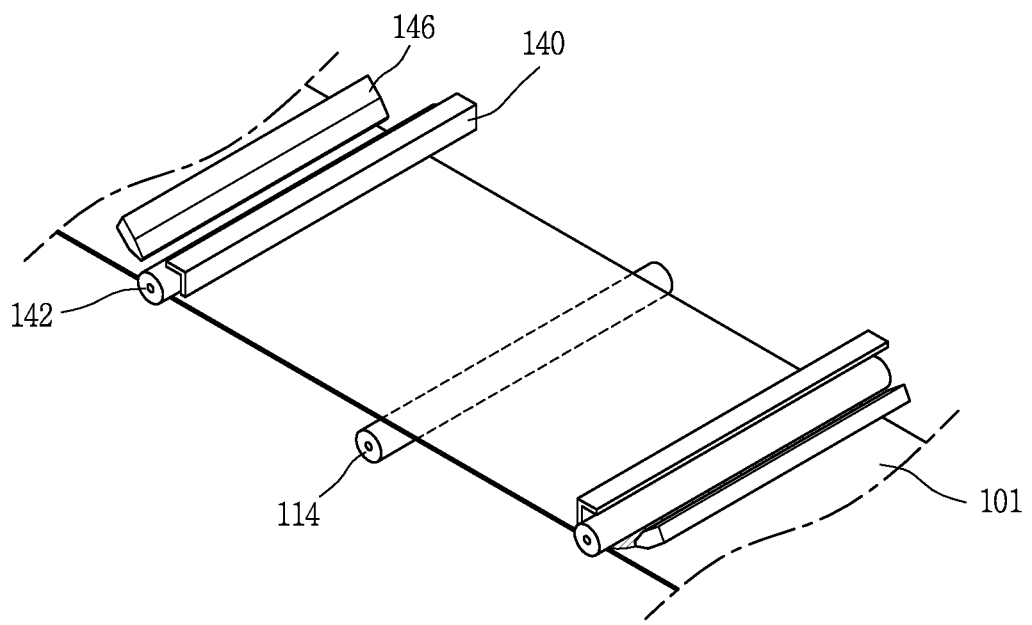
Figure 6:
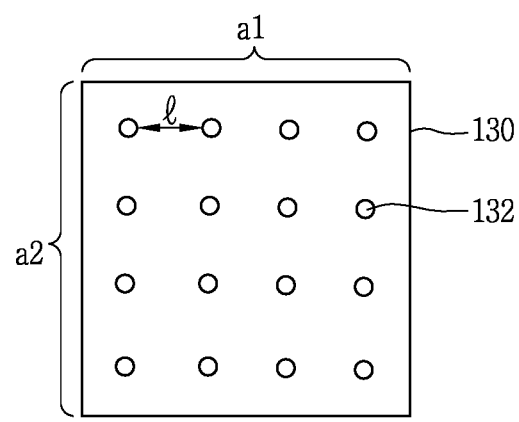
Figure 7:
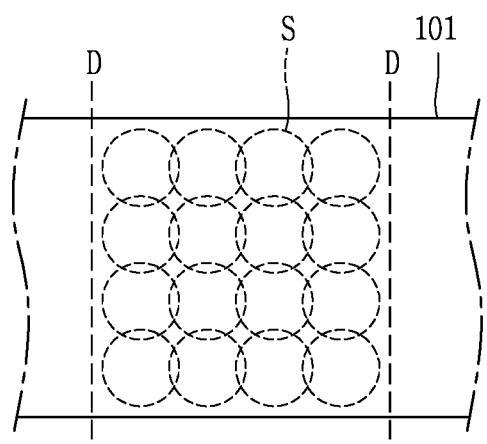
Figure 8:
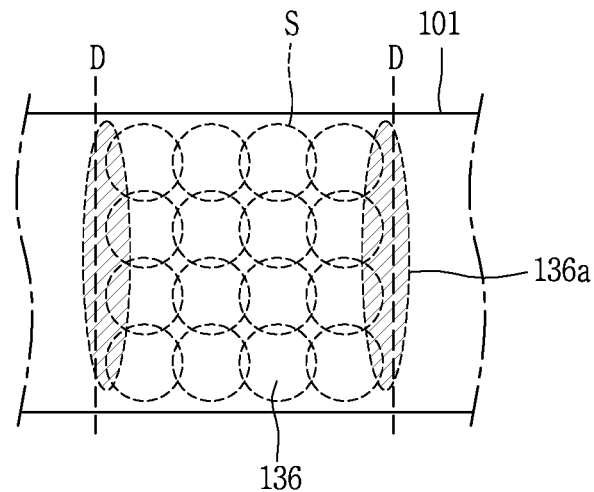
Figure 9:
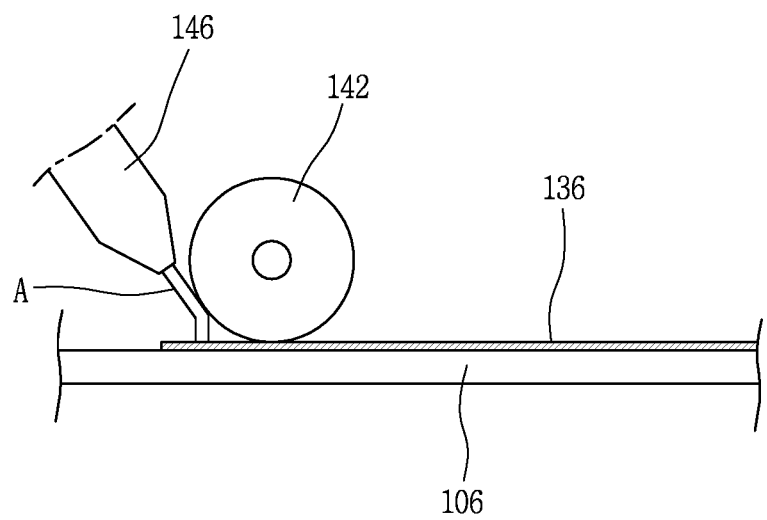

FIG. 1 is a flowchart showing a method for fabricating an organic electroluminescent device;

FIG. 2 is a flowchart showing a method for forming an electrode of a display device;

FIG. 3 is a view showing a roll to roll fabrication apparatus according to the present disclosure;

FIGS. 4A and 4B are views showing a film of the roll to roll fabrication apparatus according to the present disclosure;

FIGS. 5A and 5B are views showing a structure of a developing unit of the roll to roll fabrication apparatus according to the present disclosure;

FIG. 6 is a view showing a structure of an inject plate of the roll to roll fabrication apparatus according to the present disclosure;

FIG. 7 is a view showing an inject region on a film, the region onto which a developing solution is injected from an inject plate;

FIG. 8 is a view showing an injected state of a developing solution onto a film, in a roll to roll fabrication apparatus having no liquid blocking roll; and FIG. 9 is a view showing that air is being injected onto a film from an air curtain, in a roll to roll fabrication apparatus according to the present disclosure.

DETAILED DESCRIPTION

Hereinafter, the present disclosure will be explained in more detail with reference to the attached drawings.

In the present disclosure, a flexible display device is fabricated not in a manner that a ductile substrate such as a plastic substrate is attached onto a mother substrate formed of glass, but in a roll to roll manner. That is, the flexible display device is fabricated by implementing a plastic ductile substrate in the form of a film, by winding the film on two rolls, and then by transferring the film between the rolls.

Since processes to attach a ductile substrate onto an expensive glass mother substrate and to separate the ductile substrate from the glass mother substrate are not required in the present disclosure, fabrication costs may be reduced and fabrication processes may be simplified. Further, since the fabrication processes can be performed while a film is being consecutively transferred, an inline process can be rapidly performed in a narrow space.

Hereinafter, the roll to roll fabrication apparatus(es) according to the present disclosure will be explained by taking a specific display device as an example. However, the roll to roll fabrication apparatus according to the present disclosure may be applicable to all types of display device as well as such a specific display device. Further, the roll to roll fabrication apparatus according to the present disclosure may be applicable to all devices which include a metallic pattern, such as a lighting apparatus including an organic light emitting device.

FIG. 1 is a flowchart showing a method for fabricating an organic electroluminescent device.

As shown in FIG. 1, a plurality of gate lines and data lines which define pixel regions are formed on a film where display panels are formed in a single row or a plurality of rows, in a lengthwise direction. Then, a thin film transistor (TFT), a driving device connected to the gate line and the data line, is formed at each pixel region (S101).

Then, a transparent metallic oxide such as Indium Tin Oxide (ITO) or Indium Zinc Oxide (IZO) is laminated on each pixel region and is etched, thereby forming an anode (S102). Then, an organic light emitting material is deposited on the entire display panels, thereby forming an organic light emitting layer (S103).

Then, a metal is laminated on the organic light emitting layer and is etched, thereby forming a cathode and forming an organic light emitting device (S104). Then, a sealant is laminated to complete an organic electroluminescent device.

Such an organic electroluminescent device may be fabricated by performing fabrication processes in a consecutive inline manner by a single roll to roll process line, or by performing some fabrication processes in a consecutive inline manner by a single roll to roll process line. Alternatively, such an organic electroluminescent device may be fabricated in a single inline manner, as a plurality of roll to roll process lines for performing respective processes are assembled to each other.

FIG. 2 is a flowchart showing a metal patterning process for forming an electrode of a display device such as an organic electroluminescent device, among the fabrication processes shown in FIG. 1.

As shown in FIG. 2, a metal is laminated on a film by a deposition method such as a sputtering, for metal patterning (S201). Then, a photoresist (PR) is applied onto the metal layer (S202).

Then, in a state that a part of the photoresist is blocked by arranging a photomask over the photoresist, light such as ultraviolet rays is irradiated (S203). Then, the photoresist is patterned by using a developing solution (S204). Then, in a state that a metallic layer is blocked by the patterned photoresist, the metallic layer is etched by using an etching solution, thereby forming an electrode (S205).

In the present disclosure, the metal patterning process is performed by the roll to roll fabrication apparatus. And all processes to laminate and etch a metal may be performed in a consecutive inline manner by a single roll to roll fabrication process. Alternatively or additionally, a process to laminate a metal, a process to apply a photoresist, an exposing process, a developing process, an etching process, etc., may be consecutively performed through roll to roll fabrication processes. Alternatively or additionally, two or more processes may be consecutively performed through a single roll to roll fabrication process.

In case of performing each process or a plurality of processes through roll to roll fabrication processes, a flexible film is supplied to the roll to roll fabrication apparatus to perform a corresponding process by consecutively transferring the film. Then, when the corresponding process is terminated, the film is transferred to another roll to roll fabrication apparatus to perform a corresponding process by consecutively transferring the film. In such a manner, the metal patterning process is completed.

FIG. 3 is a schematic view showing the roll to roll fabrication apparatus 100 according to the present disclosure. As an non-limiting illustrative example, the roll to roll fabrication apparatus 100 shown in FIG. 3 serves to perform a developing process among the fabrication processes shown in FIG. 2. However, the roll to roll fabrication apparatus according to the present disclosure may be also used to perform another process such as an etching process.

As shown in FIG. 3, the roll to roll fabrication apparatus according to the present disclosure may include a first roll 110 on which a film 101 formed of a ductile material such as plastic is wound, a second roll 112 configured to collect the film 101 transferred from the first roll 110, and a plurality of guide rolls 114 disposed between the first roll 110 and the second roll 112 and configured to guide the transferred film 101. The first roll 110 and the second roll 112 are coupled to a first driving shaft 111 and a second driving shaft 113 connected to an external driving means. As the external driving means is driven, a driving force is transferred to the first and second rolls 110, 112 through at least one of the first and second driving shafts 111, 113, thereby rotating the first and second rolls 110, 112.

As the first and second rolls 110, 112 are rotated, the film 101 is transferred toward the second roll 112 from the first roll 110. A developing unit for forming a photoresist pattern by developing a photoresist 106, and a washing unit for washing the developed photoresist pattern are provided on a transfer path of the film 101. Although not shown, a deposition unit for depositing a metal, a photoresist lamination unit for applying the photoresist 106 onto a laminated metallic layer, an exposing unit for exposing the photoresist 106 to light, and an etching unit for etching the metallic layer by using the developed photoresist pattern, may be further provided on the transfer path between the first roll 110 and the second roll 112. That is, the entire processes may be performed as metal patterning processes such as a metal laminating process, a photoresist applying process, an exposing process, a developing process and an etching process, are performed in a single consecutive inline manner, in the roll to roll fabrication apparatus shown in FIG. 3.

After the metal and the exposed photoresist 106 are formed on the film 101 by the previous roll to roll process, the film is transferred to another roll to roll fabrication apparatus shown in FIG. 3 by a transfer apparatus or an operator. After the roll to roll process shown in FIG. 3 is completed, the film 101 may be also transferred to a subsequent roll to roll fabrication apparatus by a transfer apparatus or an operator, and a corresponding process (an etching process) may be performed. That is, the steps of FIG. 2 are individually performed by separate roll to roll processes, and the film is transferred to a next process region after the steps are performed, thereby undergoing a roll to roll process.

FIGS. 4A and 4B are views showing the film 101 of the roll to roll fabrication apparatus according to the present disclosure.

As shown in FIG. 4A, a plurality of panel regions 1 are arranged in a line in a lengthwise direction of the film 101. The panel regions 1 are regions where various types of devices of a display device are formed. In case of an organic electroluminescent device, the panel regions 1 are organic electroluminescent display panels. And in case of an LCD device, the panel regions 1 are LC panels. All of the processes of FIG. 1 are performed on the panel regions 1 arranged on the film 101. After all of the processes are performed, the film 101 is cut so that the plurality of panel regions 1 are separated from one another in the form of unit display panels.

As shown in FIG. 4B, as the plurality of panel regions 1 are arranged in a plurality of lines in a lengthwise direction of the film 101, 'n×m' panel regions 1 may be formed on the film 101.

A developing process by the roll to roll fabrication apparatus of FIG. 3 is performed on the film 101 shown in FIGS. 4A and 4B. That is, a metallic layer is formed on each of the plurality of panel regions 1 formed on the film 101 by the previous process, and the photoresist 106 is laminated on the metallic layer. In this state, the film 101 is supplied to the roll to roll fabrication apparatus shown in FIG. 3, for a developing process.

Although not shown, the washing unit includes a first liquid washing portion for washing a developed photoresist pattern by using a cleaning solution, a bubble jet washing portion for washing the photoresist pattern by applying a bubble jet, a second liquid washing portion for washing the photoresist pattern by using a cleaning solution, an air knife for removing the cleaning solution which remains on the photoresist pattern by injecting air, and a heat washing portion for removing the cleaning solution which remains on the photoresist pattern by applying heat. Such washing processes are performed in real time and consecutively, while the film 101 is being transferred to the second roll 112 from the first roll 110.

FIGS. 5A and 5B are views showing a structure of, e.g., a developing unit of the roll to roll fabrication apparatus according to the present disclosure. FIG. 5A is a sectional view of the roll to roll fabrication apparatus, and FIG. 5B is a perspective view of the roll to roll fabrication apparatus.

As shown in FIGS. 5A and 5B, the developing unit of the roll to roll fabrication apparatus according to the present disclosure includes a guide roll 114 for guiding the film 101 transferred to the second roll 112 from the first roll 110 shown in FIG. 3 and having the photoresist 106 on each of the plurality of panel regions; a developing solution inject plate 130 disposed above the film 101, and configured to inject a developing solution 136 onto the photoresist 106 arranged on the film 101 which is to be transferred; a pair of air curtains 146 disposed at an inlet (a upstream end, a boundary region) and an outlet (an downstream end, a boundary region) of the developing unit, and configured to prevent the developing solution injected from the developing unit, e.g., developing solution inject plate 130, from being introduced to another process region (e.g., the washing unit) by injecting air; shielding members 140 disposed at the downstream and upstream ends (boundary regions) of the developing unit, configured to prevent the developing solution injected from the developing unit, e.g., developing solution inject plate 130, from splashing to another process region, and configured to prevent air injected from the air curtains 146 from being injected into the developing unit, and thereby to prevent the developing solution from being non-uniformly applied onto the film 101 disposed at the developing unit; and liquid blocking rolls 142 disposed at the downstream and upstream ends (boundary regions) of the developing unit, configured to prevent the developing solution applied onto the developing unit from being introduced to another process region, and configured to prevent air injected from the air curtains 146 from being directly injected onto the developing solution inside the developing unit.

A metallic layer is disposed on the film 101, and the photoresist 106 is applied onto the metallic layer. However, for convenience, the metallic layer is omitted in the drawings.

As shown in FIG. 6, the developing solution inject plate 130 is formed in an approximate quadrangular shape. Here, a horizontal length (a1) of the developing solution inject plate 130 is the same as a length (D) of a region where a developing process is substantially performed in the roll to roll fabrication apparatus, and a vertical length (a2) of the developing solution inject plate 130 is almost the same as a width of the film 101. Accordingly, when the developing solution inject plate 130 is arranged above the film 101, a developing region on the film 101 (one panel region or a plurality of panel regions) is covered by the developing solution inject plate 130. As a result, a developing solution is uniformly injected on an entire part of a corresponding panel region.

A plurality of nozzles 132 are provided at the developing solution inject plate 130. Although not shown, a cavity is formed in the developing solution inject plate 130 such that a developing solution is supplied into the cavity from an external developing solution supplying unit. And the developing solution supplied to the cavity is injected onto the film 101 through the nozzles 132.

The nozzles 132 are arranged at the developing solution inject plate 130 in a matrix shape with a preset interval ($\ell$) therebetween. Here, a pitch between the nozzles 132 is determined based on a height (h) of the developing solution inject plate 130 disposed above the film 101, and based on an inject angle ($\theta$) of the developing solution 136 injected from the nozzles 132. It is preferable to partially overlap inject regions on the film 101 with one another, where the developing solution from one nozzle 132 is injected.

That is, as shown in FIG. 7, the developing solution 136 injected from one nozzle 132 is applied onto circular inject regions (S) on the photoresist 106 of the film 101. And the inject regions (S) on which the developing solution 136 from the plurality of nozzles 132 are injected, are overlapped with neighboring inject regions (S). In this case, the nozzles 132 of the first row and the last row, provided at the developing solution inject plate 130, inject the developing solution 136 onto regions near boundary lines (D) for neighboring processes of the film 101. Preferably, edge regions of the inject regions (S) near the boundary lines (D) for neighboring processes overlap the boundary lines (D). The reason is because a large amount of developing solution may be introduced into another process region, as the large amount of developing solution is applied near the boundary lines (D) in a case where central regions of the inject regions (S) are positioned near the boundary lines (D).

Since the developing solution 136 has fluidity of a liquid state, it flows on the film 101 to thus be applied onto the film 101 with a uniform thickness, thereby uniformly developing the photoresist 106. As a result, the photoresist may be always patterned in a preset shape.

The roll to roll fabrication apparatus according to the present disclosure may be also applicable to another process such as an etching process, as well as a developing process. For instance, when the roll to roll fabrication apparatus according to the present disclosure is used for an etching process, an etching solution not a developing solution may be injected from the developing solution inject plate 130. In this case, the developing solution inject plate 130 may be referred to as an etching solution inject plate.

That is, the roll to roll fabrication apparatus according to the present disclosure may be applicable to all of fabrication processes of a display device. And the developing solution inject plate 130 may include a chemical treatment liquid such as chemicals used in a corresponding fabrication process.

The air curtains 146 are arranged at the upstream and downstream ends of the developing unit, i.e., near the two boundary lines (D), and serve to prevent the developing solution 136 injected onto the developing unit from being introduced to another process region, by injecting air onto the film 101 near the boundary lines (D).

Since the developing solution 136 has fluidity of a liquid state, it flows to another process region, even if it is applied onto the film 101 with a uniform thickness. Furthermore, the developing solution 136 injected to regions near the boundary lines (D) may be introduced to other regions by passing over the boundary lines (D) by an injection force of the nozzles 132. The air curtains 146 inject air onto the film 101 near the boundary lines (D), thereby preventing the developing solution from being introduced into other process regions.

The shielding members 140 prevent the developing solution injected from the developing unit from splashing to other process regions, and prevent a non-uniform application state of the developing solution disposed on the film 101 and arranged at the developing unit, by injecting air provided from the air curtains 146 into the developing unit. In the drawings, the shielding members 140 are formed in "]" shape. However, the shielding members 140 may be formed in a vertical wall shape disposed vertically, or in another shape, which are all included in the disclosure. The shielding members 140 may be formed in any shape, if it can prevent air provided from the air curtains 146 from being injected to the developing unit, or if it can prevent the developing solution injected from the developing unit from splashing to other process regions.

The liquid blocking rolls 142 are arranged at the upstream and downstream ends of the developing unit, i.e., near the two boundary lines (D) of the developing unit. The liquid blocking rolls 142 are arranged between the two boundary lines (D) of the developing unit and the air curtains 146, and prevent air provided from the air curtains 146 from being directly injected onto the developing solution inside the developing unit. The reason is as follows.

FIG. 8 is a view showing an injected state of the developing solution 136 onto the film 101, in a case where the liquid blocking rolls 142 are not provided. Since the developing solution 136 applied in a liquid state flows along the surface of the film 101 by its fluidity, it may flow to a next process region. The air curtains 146 are provided at the boundary lines (D) of the developing unit, thereby preventing the developing solution 136 from being introduced to other process regions by passing over the boundary lines (D).

However, in the case of preventing the flow of the developing solution by injecting air, the developing solution backflows to the developing unit by an injection force of the air. As a result, the developing solution is not uniformly applied to the developing unit. Accordingly, as shown in FIG. 8, as force of air is applied to the developing solution 136 near the boundary lines (D), foam 136a is generated from the developing solution.

The developing solution 136 applied onto the photoresist 106 is chemically bonded with the photoresist 106, thereby removing the photoresist 106 in a developing manner. However, such foam 136a prevents a contact between the developing solution 136 and the photoresist 106, thereby lowering a bonding therebetween. Accordingly, the photoresist 106 is incompletely developed by the foam 136a, and the undesired photoresist 106 remains on a metallic layer. Eventually, the metallic layer cannot be completely etched, resulting in inferior display panels.

The liquid blocking rolls 142 of the preset disclosure prevent air provided from the air curtains 146 from being directly applied onto the developing solution 136 applied onto the photoresist 106, thereby preventing a backflow of the developing solution 136 and occurrence of foam.

As shown in FIG. 9, in the present disclosure, air (A) provided from the air curtain 146 is not directly injected onto the developing solution applied onto the photoresist 106 on the film 101, but is injected onto the liquid blocking roll 142. Accordingly, the air (A) provided from the air curtain 146 is injected to a lower part of an outer side of the liquid blocking roll 142 (i.e., an outer side of the developing unit), via an outer circumferential surface of the liquid blocking roll 142.

Since the air (A) is not directly injected into the developing unit, it is not directly applied onto the developing solution 136 inside the developing unit, or the developing solution 136 being injected. This may prevent the developing solution 136 from flowing to another process region. Further, this may prevent splashing of the developing solution 136 to a neighboring process region, or a non-uniform application of the developing solution inside the developing unit, through air injection.

Since the air (A) provided from the air curtain 146 is injected via the outer circumferential surface of the liquid blocking roll 142, a force to block the developing solution 136 is reduced. However, since the developing solution 136 is primarily prevented from flowing to another process region by the liquid blocking roll 142, the overall blocking efficiency for the developing solution 136 is not lowered.

Further, in the present disclosure, since the air (A) is not directly injected onto the developing solution 136, occurrence of foam 136a due to the air injection may be prevented. Also, even when foam occurs, the foam may be prevented from being introduced into the developing unit by the liquid blocking roll 142. This may prevent a non-uniform state of the photoresist due to foam occurring in the developing solution 136.

Moreover, in the present disclosure, since the liquid blocking roll 142 is spaced apart from the film 101 by a preset distance, the developing solution 136 applied onto the film 101, when the film 101 is transferred while passing through the liquid blocking roll 142, has its thickness maintained constantly as a thickness between the liquid blocking roll 142 and the photoresist. Accordingly, the photoresist may be developed more uniformly.

Further, since the liquid blocking roll 142 is installed to be moveable up and down, an interval between the liquid blocking roll 142 and the film 101 can be controlled. As the interval between the liquid blocking roll 142 and the film 101 is controlled according to a thickness of the photoresist and a type of the developing solution, etc., a developing operation may be efficiently performed.

In the present disclosure, the developing solution is primarily prevented from being introduced to another process region from the developing unit, by the liquid blocking rolls 142. And the developing solution is secondarily prevented from being introduced to another process region, through air injection by the air curtains 146. This may effectively prevent the developing solution from being introduced to another process region.

Moreover, in the present disclosure, air injected from the air curtains 146 is not directly applied into the developing unit by the liquid blocking rolls 146. Accordingly, occurrence of foam from a developing solution inside the developing unit may be prevented, and the developing solution may maintain a constant thickness by the liquid blocking rolls 146. This may allow a photoresist pattern to maintain a constant thickness.

When the liquid blocking rolls 146 are not provided, a maximum deviation of a photoresist pattern to be developed is more than about 1.8 μm. On the other hand, when the roll to roll fabrication apparatus of the present disclosure is used, the deviation of the photoresist pattern is reduced to about 0.54 μm. Accordingly, in case of etching a metallic layer, etc., an inferiority due to the deviation of the photoresist pattern may be reduced. Further, even when a small amount of photoresist is applied, a desired etching operation may be performed without an inferiority. This may reduce the fabrication costs, and prevent environmental pollution due to a large amount of photoresist.

Further scope of applicability of the present application will become more apparent from the detailed description given herein. However, it should be understood that the detailed description and specific examples, while indicating example embodiments of the disclosure, are given by way of illustration only, since various changes and modifications within the concept and scope of the disclosure will become apparent to those skilled in the art from the detailed description.

In the aforementioned descriptions, a specific configuration(s) of the present disclosure has been explained. However, the present disclosure is not limited to such a specific configuration(s), but may include various modifications.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A roll to roll fabrication apparatus, comprising:
a supplying roll and a collecting roll configured to transfer a film therebetween;
an injection plate above a transfer path of the film, which is configured to inject a chemical treatment liquid on a first portion of a top surface of the film positioned within a corresponding process region;
liquid blocking rolls at boundaries of the corresponding process region and over the top surface of the film, the liquid blocking rolls configured to prevent the chemical treatment liquid injected on the first portion of the top surface of the film from flowing to a second portion of the top surface of the film that is positioned outside the corresponding process region, outer surfaces of the liquid blocking rolls being outside the boundaries of the corresponding process region;
air curtains at the boundaries of the corresponding process region, which is configured to inject air onto lower parts of the outer surfaces of the liquid blocking rolls via the outer surfaces of the liquid blocking rolls, each of the air curtains being positioned outside the respective liquid blocking rolls and spaced apart from the respective liquid blocking rolls; and
shielding members at the boundaries of the corresponding process region, the shielding members being positioned on and at least partially overlapping the liquid blocking rolls,
wherein the liquid blocking rolls are arranged between the air curtains and the corresponding process region such that the liquid blocking rolls prevent the air provided from the air curtains from being directly injected onto the chemical treatment liquid inside the corresponding process region, and
wherein the liquid blocking rolls are positioned between the shielding members and the air curtains.

2. The roll to roll fabrication apparatus of claim 1, wherein the injection plate includes a developing solution injection plate for injecting a developing solution.

3. The roll to roll fabrication apparatus of claim 1, wherein the injection plate includes an etching solution injection plate for injecting an etching solution.

4. The roll to roll fabrication apparatus of claim 1, wherein the liquid blocking rolls are moveable up and down.

5. The roll to roll fabrication apparatus of claim 4, wherein the liquid blocking rolls are configured to perform an up-down movement based at least in part on a thickness of the chemical treatment liquid to be applied.

6. The roll to roll fabrication apparatus of claim 1,
wherein the air curtains include a first air curtain at an inlet of the corresponding process region, and
wherein the liquid blocking rolls include a first liquid blocking roll between the first air curtain and the corresponding process region.

7. The roll to roll fabrication apparatus of claim 6, further comprising a second air curtain at an outlet of the corresponding process region and a second liquid blocking roll between the second air curtain and the corresponding process region.

8. The roll to roll fabrication apparatus of claim 1, wherein the shielding members include a first shielding member and a second shielding member that are integrally formed, the second shielding member extending from one end of the first shielding member.

9. The roll to roll fabrication apparatus of claim 8, wherein the first shielding member and the second shielding member have a plate-like shape, the first shielding member having a first width and a first length, the second shielding member having a second width and a second length, the second shielding member extending from the first shielding member along the second length of the second shielding member and the first length of the first shielding member.

10. The roll to roll fabrication apparatus of claim 9, wherein the liquid blocking rolls have a cylindrical-like shape, the liquid blocking rolls having a first radius and a first diameter, the first width of the first shielding member being greater than the first radius and less than the first diameter, the second width of the second shielding member being greater than the first radius and less than the first diameter.

11. The roll to roll fabrication apparatus of claim 10, wherein the shielding members are spaced apart from the film by at least the first radius of the liquid blocking rolls, and are arranged below the injection plate.

* * * * *